United States Patent [19]
Ogino et al.

[11] Patent Number: 6,156,152
[45] Date of Patent: Dec. 5, 2000

[54] PLASMA PROCESSING APPARATUS

[75] Inventors: Satoshi Ogino; Kazumasa Yonekura; Hajime Kimura; Shigenori Sakamori, all of Tokyo, Japan

[73] Assignee: Mitsubishi Denki Kabushiki Kaisha, Tokyo, Japan

[21] Appl. No.: 08/958,986

[22] Filed: Oct. 28, 1997

[30] Foreign Application Priority Data

Jun. 5, 1997 [JP] Japan ................................. 9-147601

[51] Int. Cl.[7] .................................................. C23F 1/02
[52] U.S. Cl. ................................. 156/345; 118/723 MW
[58] Field of Search .................. 156/345; 118/723 MW, 118/723 ME, 723 MR, 723 MA; 315/111.41; 204/298.16, 298.37, 298.38

[56] References Cited

U.S. PATENT DOCUMENTS

| | | | |
|---|---|---|---|
| 5,389,154 | 2/1995 | Hiroshi et al. | 118/723 MR |
| 5,433,789 | 7/1995 | Kakehi et al. | 118/723 MW |
| 5,435,886 | 7/1995 | Fujiwara et al. | |
| 5,587,205 | 12/1996 | Saito et al. | 427/553 |
| 5,698,036 | 12/1997 | Ishii et al. | 118/723 MW |
| 5,804,033 | 9/1998 | Kanai et al. | 156/643.1 |
| 5,827,465 | 10/1998 | Samukawa | 216/69 |
| 5,874,706 | 2/1999 | Ishii et al. | 219/121.43 |
| 5,914,051 | 6/1999 | Kanai et al. | 216/69 |

FOREIGN PATENT DOCUMENTS

| | | |
|---|---|---|
| 61-263125 | 11/1986 | Japan . |
| 63-54934 | 3/1988 | Japan . |
| 4-174514 | 6/1992 | Japan . |
| 6-267900 | 9/1994 | Japan . |
| 8-88218 | 4/1996 | Japan . |
| 8-139077 | 5/1996 | Japan . |

*Primary Examiner*—Frankie L. Stinson
*Attorney, Agent, or Firm*—Oblon, Spivak, McClelland, Maier & Neustadt, P.C.

[57] ABSTRACT

Provided is a plasma processing apparatus capable of extending an etching parameter to reduce charge-up shape anomalies in dry etching and to enhance etching performance such as selectivity, uniformity, processability or the like. A microwave is controlled to be modulated in frequency and is introduced into a chamber. An ECR face is moved between two positions according to the frequency of the microwave.

6 Claims, 16 Drawing Sheets

F I G. 1 4
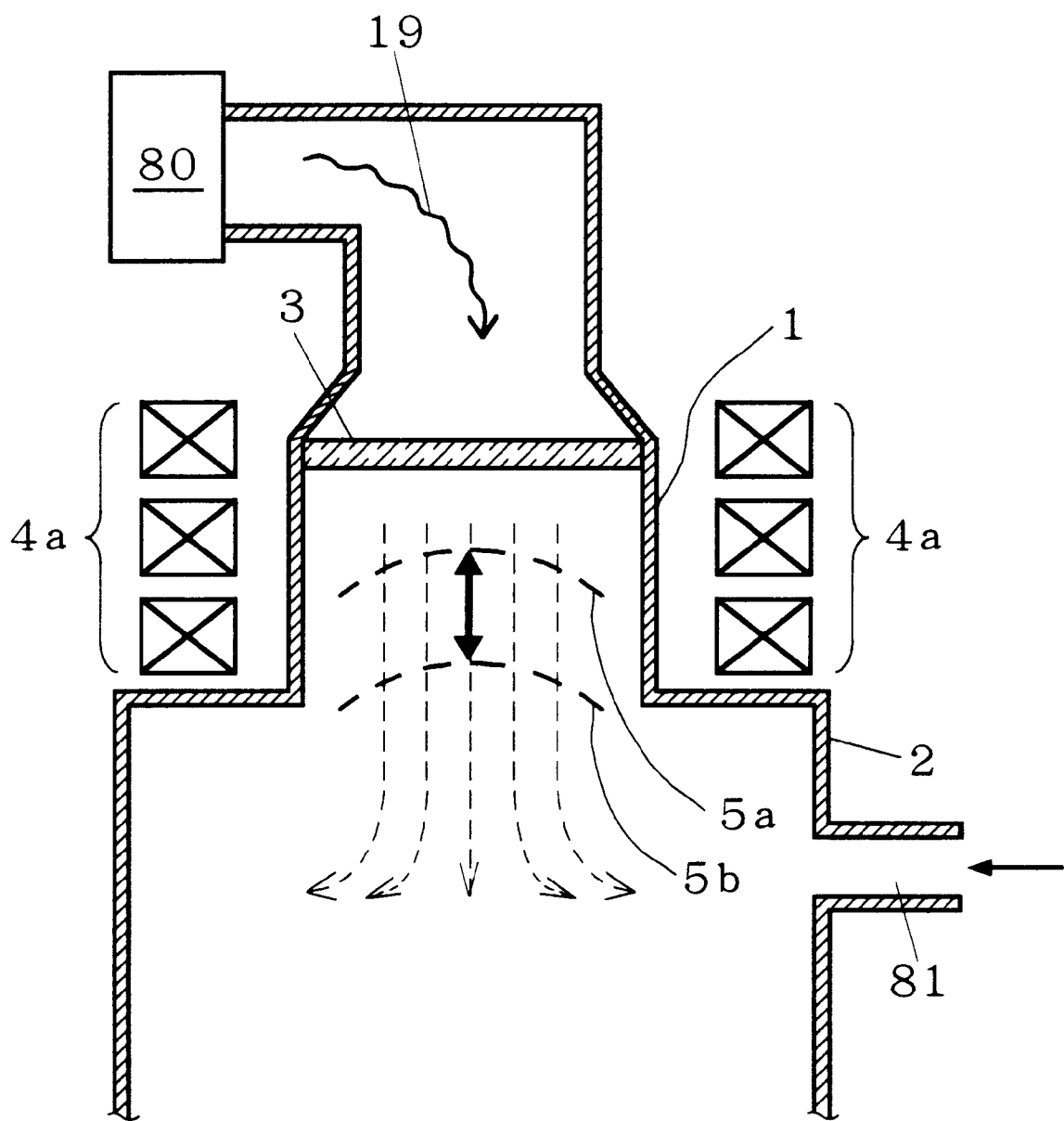

PLASMA PROCESSING APPARATUS

BACKGROUND OF THE INVENTION

1. Field of the Invention

The present invention relates to a plasma processing apparatus, and more particularly to a dry etching apparatus.

2. Description of the Background Art

FIG. 21 is a sectional view conceptually showing an ECR (Electron Cycrotron Resonance) etching apparatus which is a kind of a plasma processing apparatus according to the prior art. In a plasma production chamber 1, a plasma is produced from a process gas by a microwave 19. The plasma is sent to a reaction chamber 2. A wafer 7 biased with a RF power obtained from RF power feeding means 8 is exposed to the plasma.

There are various parameters to control an etching process of the ECR etching apparatus. Examples of the parameters include a shape and a position of an ECR region represented by an ECR face 5 (which also depend on a magnetic field given by a main coil 4a and a mirror coil 4b), the microwave 19, a method for electrostatically chucking the wafer 7, a pressure of the process gas, and the like.

It has become harder to implement etching having higher anisotropy, selectivity and uniformity with higher integration and fineness of a device. In many cases, existing etching parameters are not enough to implement the etching having higher anisotropy, selectivity and uniformity. In recent years, anomalies in an etching shape caused due to charge-up (hereinafter referred to as "charge-up shape anomalies") have been notable as a problem of impeding fineness.

FIGS. 22 and 23 are enlarged sectional views for explaining the charge-up shape anomalies in a vicinity of a surface of a semiconductor wafer 101, and showing behaviors of ions (indicated at "+" around which a circle is put) and electrons (indicated at "−" around which a circle is put) obtained when performing fine pattern etching of the semiconductor wafer 101 using plasma etching.

In FIG. 22, a $SiO_2$ film 13, a Si film 14 and a resist pattern 15 are sequentially formed on the surface of the semiconductor wafer 101. By using the resist pattern 15 as a mask, etching is performed. With progress of the etching, both the ions and the electrons are incident on a surface of the resist pattern 15. Consequently, electrical neutrality can be kept.

In a fine pattern 16, the ions are incident perpendicularly to the surface of the semiconductor wafer 101. Therefore, the ions do not collide with a side wall 17 of the fine pattern 16 but reach a bottom face 18 of the fine pattern 16. On the other hand, the electrons have no directionality and are also injected into the side wall 17. Therefore, it is hard for the electrons to reach the bottom face 18.

As shown in FIG. 22, when a conductive film such as the Si film 14 is etched, the ions incident on the bottom face 18 and the electrons incident on the side wall 17 are recombined and neutralized in the Si film 14. Consequently, the electrical neutrality can be kept. However, when the etching progresses so that the bottom face 18 is moved downward and an insulating film such as the $SiO_2$ film 13 is exposed as shown in FIG. 23, the ions incident on the bottom face 18 and the electrons incident on the side wall 17 are not neutralized so that the bottom face 18 is positively charged up. On the other hand, the side wall 17 is negatively charged up by the electrons incident thereto.

Accordingly, an orbit of an ion incident on the bottom face 18 is curved by repulsion of positive electric charges on the bottom face 18 which has been positively charged up and attraction on the side wall 17 which has been negatively charged up. Therefore, the ions locally are incident on an interface of the Si film 14 and the $SiO_2$ film 13 so that a so-called notch is generated (a notch quantity is shown by "A" in FIG. 23).

SUMMARY OF THE INVENTION

A first aspect of the present invention is directed to a plasma processing apparatus comprising a chamber for storing a sample to be processed, microwave introducing means for introducing a microwave into the chamber, and magnetic field applying means for applying a magnetic field to the chamber, a plasma produced by the microwave and the magnetic field being exposed to the sample, wherein a frequency of the microwave is changed with the passage of time.

A second aspect of the present invention is directed to a plasma processing apparatus comprising a chamber for storing a sample to be processed, microwave introducing means for introducing a microwave into the chamber, and magnetic field applying means for applying a magnetic field to the chamber, wherein a plasma produced by the microwave and the magnetic field being exposed to the sample, and the microwave introducing means changes distribution of an electromagnetic field of the microwave with the passage of time.

A third aspect of the present invention is directed to the plasma processing apparatus according to the second aspect of the present invention, wherein the microwave introducing means is formed by a liquid crystal.

A fourth aspect of the present invention is directed to the plasma processing apparatus according to the second aspect of the present invention, wherein the microwave introducing means has a layer structure of first to third dielectrics, and a thickness of the second dielectric interposed between the first and third dielectrics is changed with the passage of time.

A fifth aspect of the present invention is directed to a plasma processing apparatus comprising a power supply for applying, to a sample to be processed, an ESC voltage to electrostatically chuck the sample to a stage and to mount the sample on the stage, a chamber for storing the stage and the sample, microwave introducing means for introducing a microwave into the chamber, and magnetic field applying means for applying a magnetic field to the chamber, wherein a plasma produced by the microwave and the magnetic field being exposed to the sample, and the ESC voltage is intermittently turned ON.

According to the first aspect of the present invention, the frequency of the microwave is changed with the passage of time so that a position of the ECR region can be changed with the passage of time. Consequently, the trade-off of the anisotropy of the plasma processing and the charge-up can be improved.

According to the second aspect of the present invention, the distribution of the electromagnetic field of the microwave is changed with the passage of time. Consequently, a portion to be easily charged up is not fixed.

According to the third aspect of the present invention, the liquid crystal is driven rapidly. Therefore, when changing the distribution of the electromagnetic field of the microwave in the form of a pulse, the distribution of the electromagnetic field is rarely brought into a transient state. Thus, unstable factors can be eliminated.

According to the fourth aspect of the present invention, the distribution of the electromagnetic field of the microwave is changed with the passage of time. Consequently, a portion to be easily charged up is not fixed.

According to the fifth aspect of the present invention, different kinds of charged particles arrive at the sample in response to ON/OFF of the ESC voltage. Thus, the trade-off of the plasma processing having the anisotropy and the charge-up can be improved.

In order to solve the above-mentioned problems, it is an object of the present invention to implement a fine processing and more particularly to change a state of a plasma during dry etching to reduce charge-up shape anomalies.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a sectional view showing an ECR etching apparatus according to a sixth embodiment of the present invention;

DESCRIPTION OF THE PREFERRED EMBODIMENTS

First Embodiment

Figure 1:
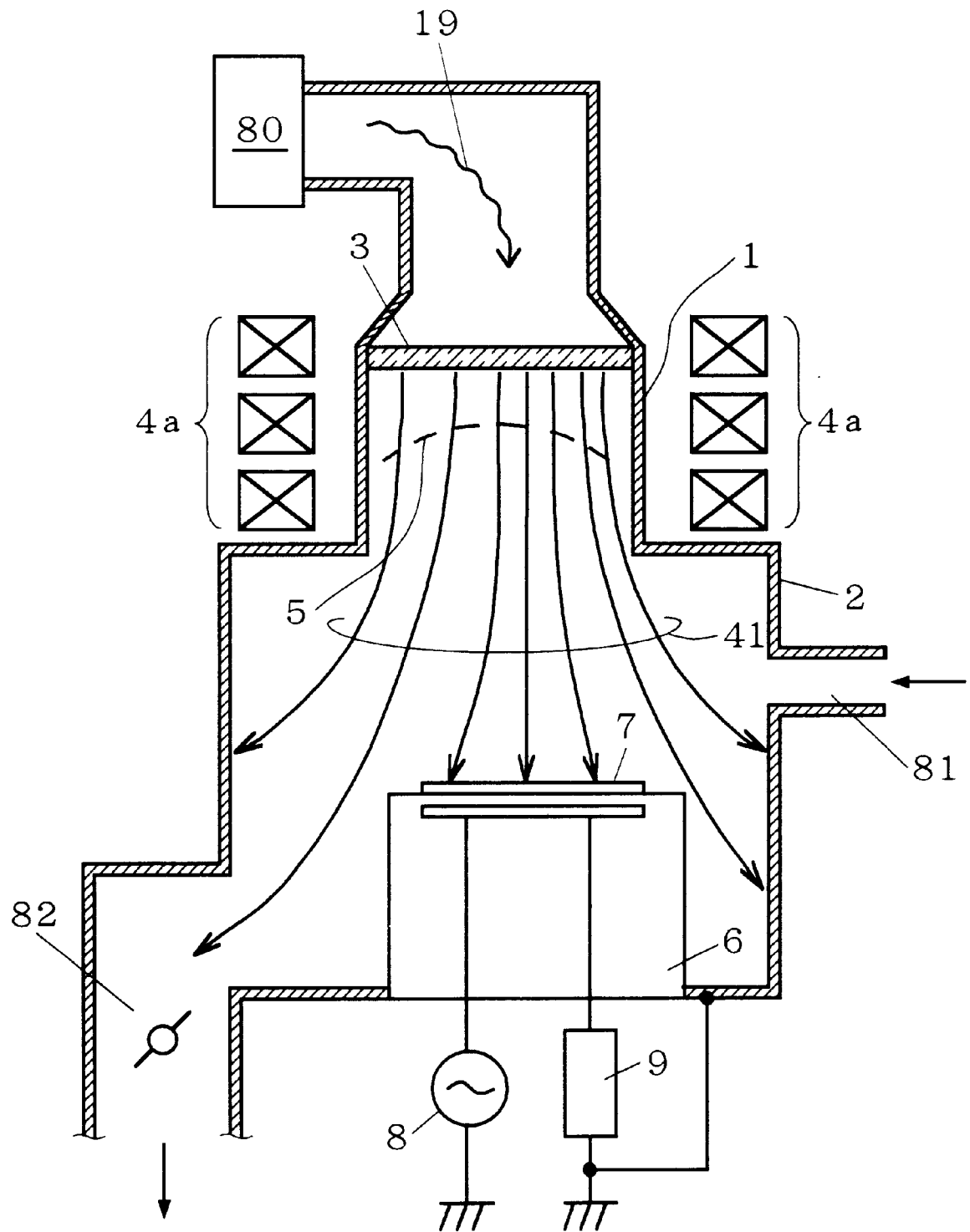
FIGS. 1 and 2 are sectional views showing an ECR etching apparatus according to a first embodiment of the present invention.
Figure 2:
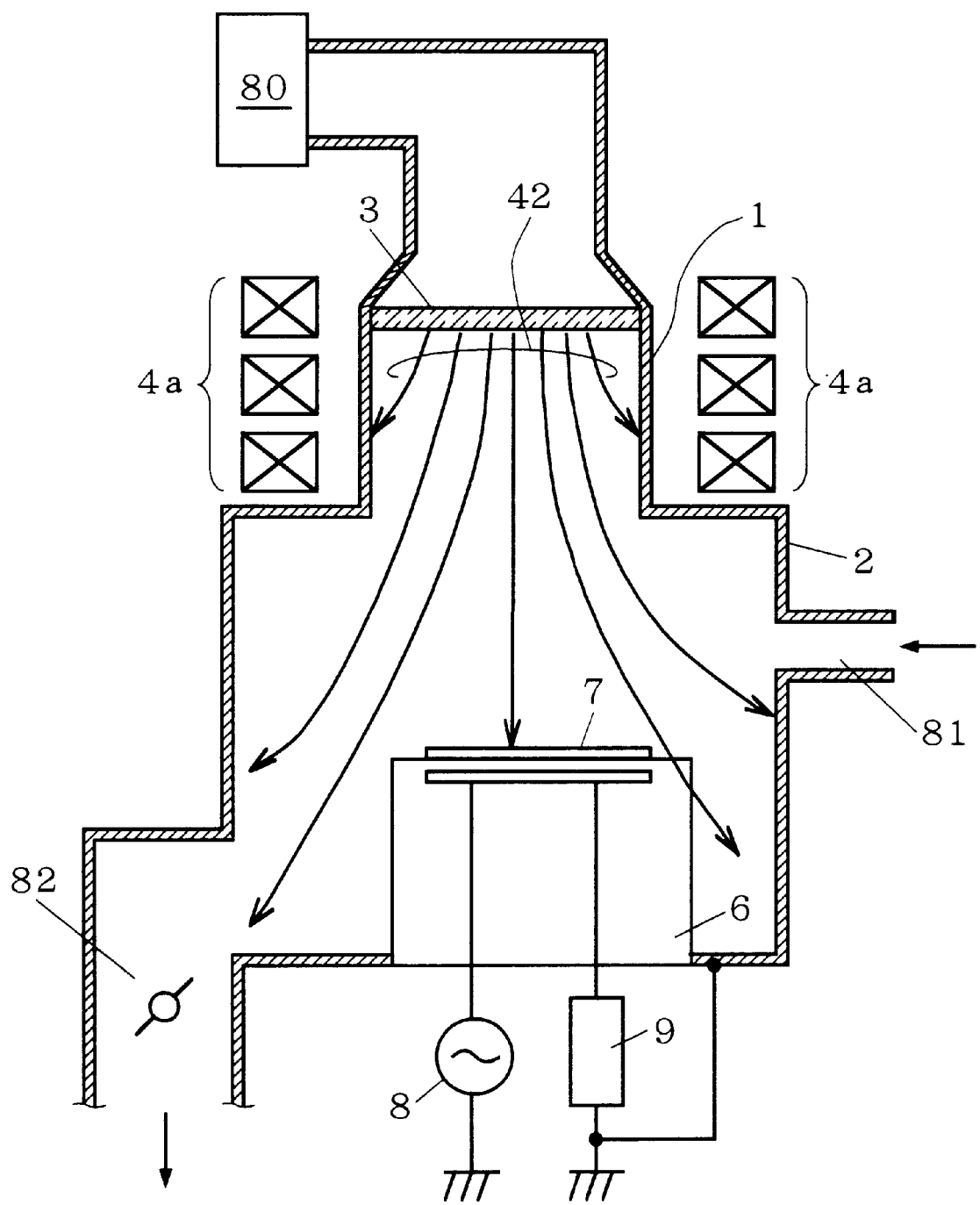

FIGS. 1 and 2 are sectional views conceptually showing an ECR etching apparatus which acts as a plasma processing apparatus according to a first embodiment of the present invention. A chamber of the ECR etching apparatus has a structure which is broadly divided into a plasma production chamber 1 and a reaction chamber 2. A reactive process gas is introduced from an inlet 81 into the chamber as shown by an arrow, and is exhausted from an exhaust outlet 82 as shown by an arrow so that a predetermined pressure can be kept. A RF power feeder 8 is connected to a stage 6. A wafer 7 mounted on the stage 6 is etched while receiving a bias voltage by a RF power. Furthermore, the wafer 7 comes in contact with the stage 6 by electrostatic chucking with a power supply 9 and is cooled.

A microwave 19 having a frequency of 2.45 GHz is introduced in the form of a pulse from a $\mu$-wave power supply 80 into the chamber through a waveguide and a leading window 3. Hereinafter, the microwave 19 which is introduced in the form of the pulse will be referred to as a pulse $\mu$-wave. FIGS. 1 and 2 show ON/OFF states of the pulse $\mu$-wave, respectively.

Figure 3:
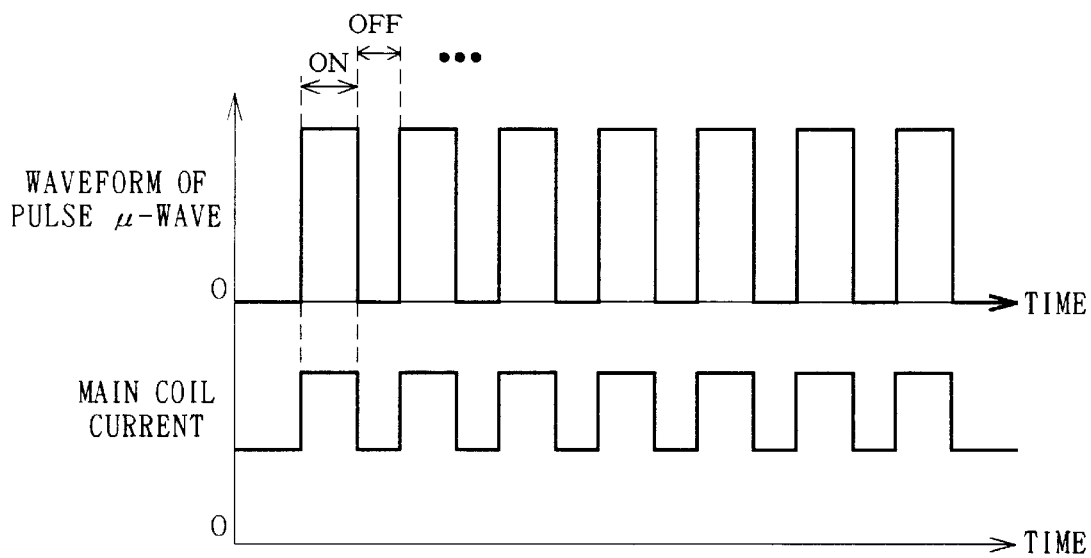
FIGS. 3 and 4 are timing charts showing the operation of the ECR etching apparatus according to the first embodiment of the present invention.

In the present embodiment, a current (main coil current) flowing to a main coil 4a is also increased or decreased corresponding to the ON/OFF states of the pulse $\mu$-wave. FIG. 3 is a timing chart showing a relationship between the ON/OFF states of the pulse $\mu$-wave and an increase or a decrease in the main coil current. By causing the main coil current to flow, a magnetic field is applied into the chamber. Therefore, an ECR resonance region (ECR face) 5 exists in the plasma production chamber 1 for a period in which the pulse $\mu$-wave is ON and an ECR plasma is produced (FIG. 1). The magnetic field formed by the main coil 4a diverges from the plasma production chamber 1 to the reaction chamber 2. Therefore, the ECR plasma is transported to the wafer 7 mounted on the stage 6. The wafer 7 is etched by the ECR plasma. On the other hand, the ECR face 5 does not exist in the plasma production chamber 1 for a period in which the pulse $\mu$-wave is OFF (FIG. 2).

As described above, since charge-up progresses while the microwave 19 exists, it does not progress for the period in which the pulse $\mu$-wave is OFF. On the contrary, a difference in directionality between ions and electrons is not made so that the electrons can also be incident on the bottom face 18. Thus, the charge-up can be eliminated. In other words, the charge-up which progresses during the ON state of the pulse $\mu$-wave is eliminated during the OFF state of the pulse $\mu$-wave.

If the pulse $\mu$-wave is turned ON/OFF and the magnetic field in the chamber is not changed, the electrons are not transported to the bottom face 18 efficiently. The reason is that the electrons receive Lorentz's force and are moved winding around a magnetic line of force. In the present embodiment, a magnetic line of force 42 for the period in which the pulse $\mu$-wave is OFF (FIG. 2) has higher divergent properties than those of a magnetic line of force 41 for the period in which the pulse $\mu$-wave is ON (FIG. 1). Thus, a vertical speed component of the electrons, that is, charged particles to the wafer 7 is accelerated according to a conservation law of a magnetic moment so that the electrons are transported to the bottom face 18 efficiently. Accordingly, the charge-up is eliminated efficiently for the period in which the pulse $\mu$-wave is OFF.

For example, an ON/OFF cycle of the pulse μ-wave is set to several hundreds microseconds. More specifically, ON/OFF periods can equally be set to one hundred microseconds. For a period in which a plasma is not produced, the charge-up is eliminated by the electrons existing in the chamber. Therefore, it is desired that the period in which the pulse μ-wave is OFF should be set within a period in which the electrons produced by the plasma do not decay in order to perform etching efficiently.

Figure 4:
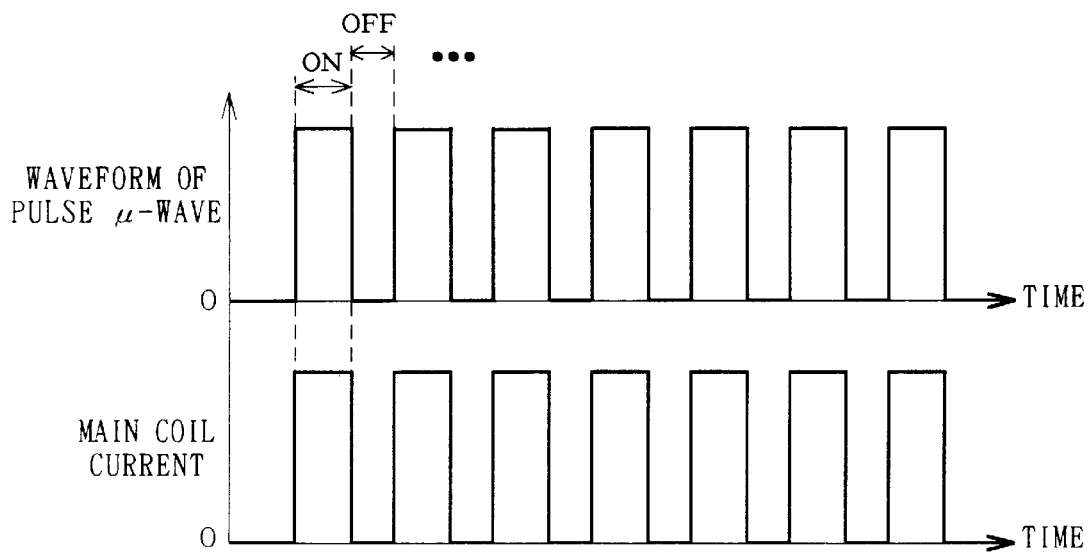
Figure 5:
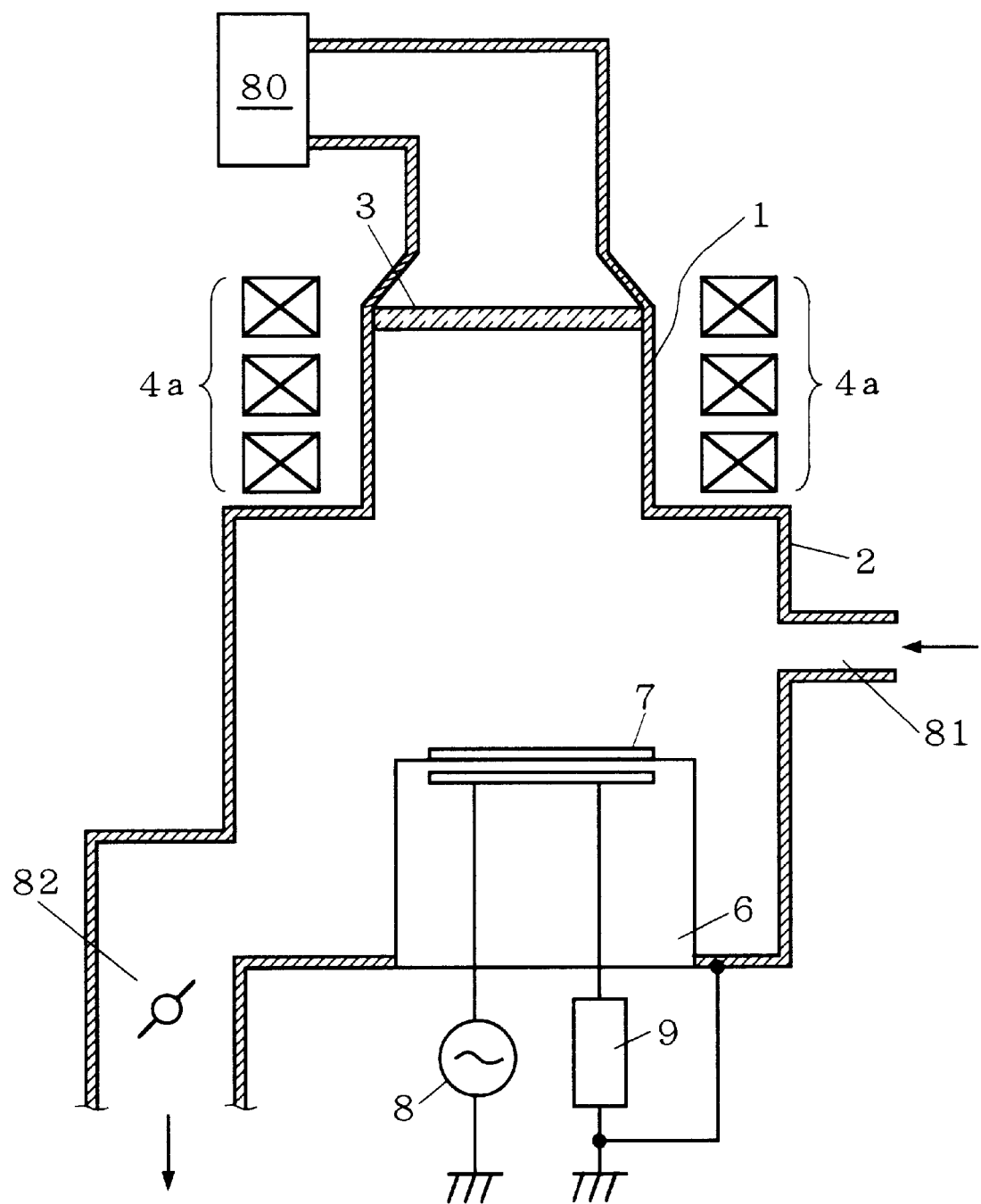
FIG. 5 is a sectional view showing a variant of the operation of the ECR etching apparatus according to the first embodiment of the present invention.

The main coil current flowing for the period in which the pulse μ-wave is OFF can be set to about a half of that for the period in which the pulse μ-wave is ON. Furthermore, the main coil current flowing for the period in which the pulse μ-wave is OFF may be set to zero as shown in a timing chart of FIG. 4. In this case, the magnetic line of force does not exist in the chamber and the electrons are efficiently transported onto the wafer 7 without winding around the magnetic line of force as shown in a sectional view of FIG. 5.

Second Embodiment

Divergent properties of a magnetic line of force in a chamber can be changed without controlling a main coil current.

Figure 6:
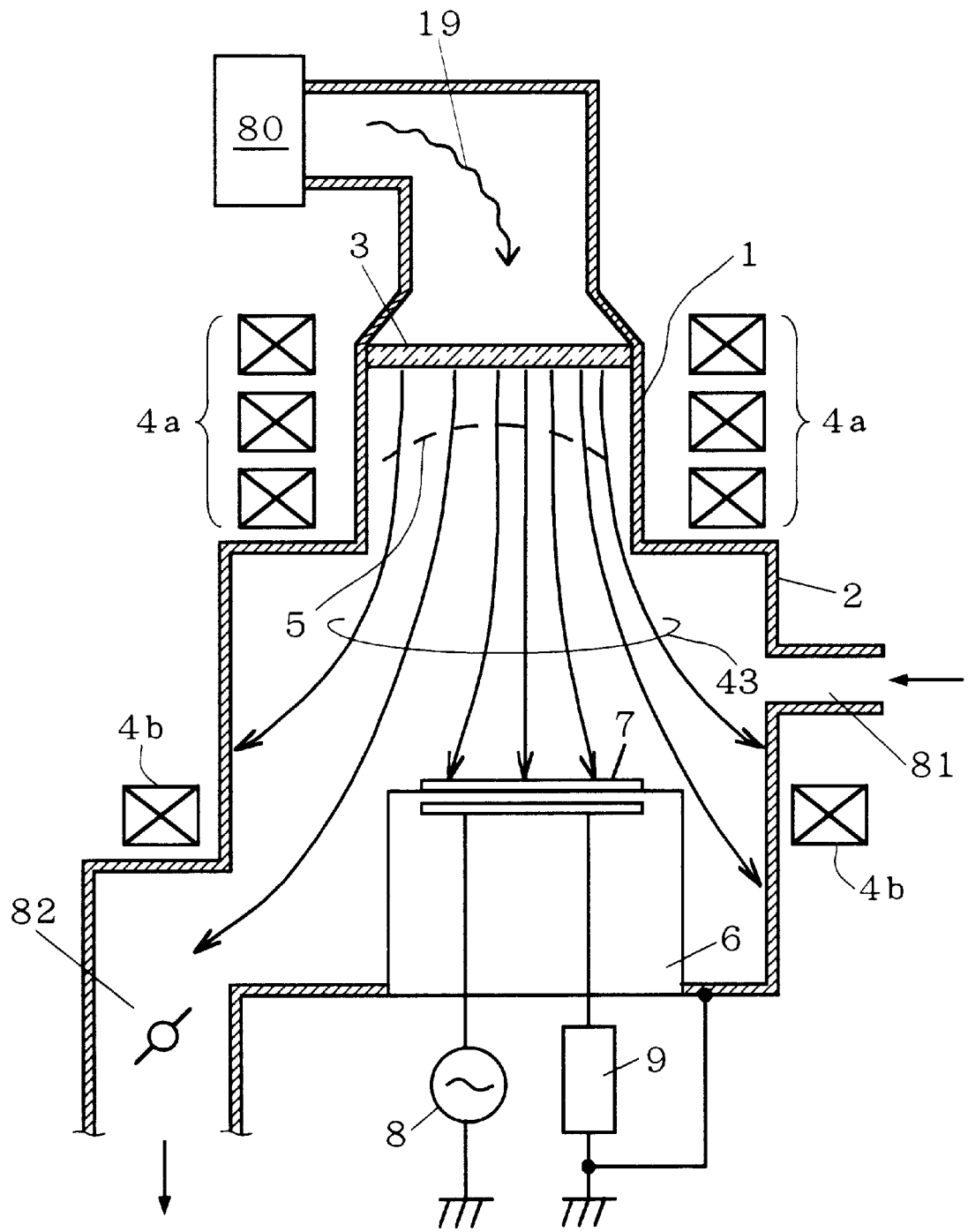
FIGS. 6 and 7 are sectional view showing an ECR etching apparatus according to a second embodiment of the present invention.
Figure 7:
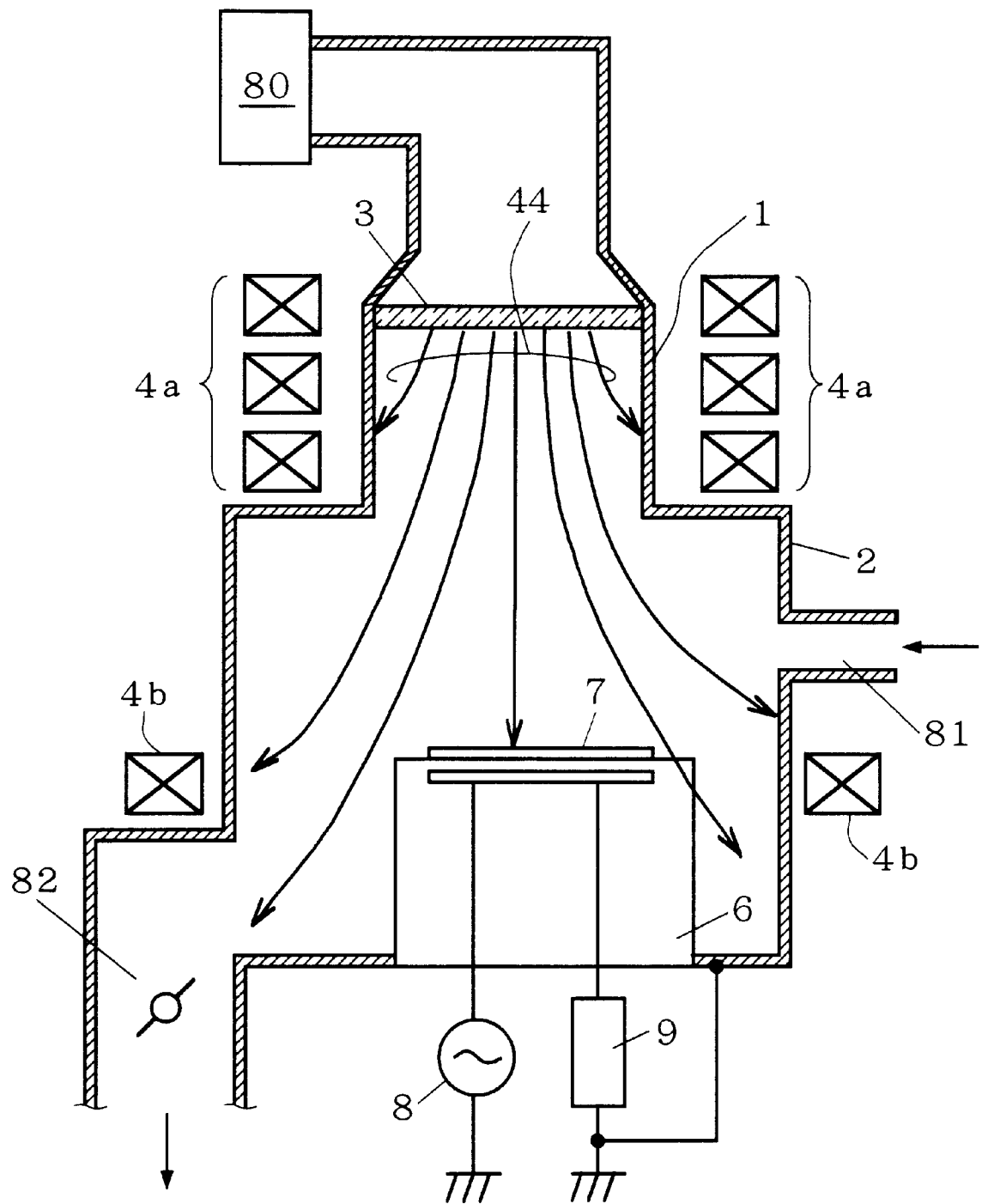

FIGS. 6 and 7 are sectional views conceptually showing an ECR etching apparatus which acts as a plasma processing apparatus according to a second embodiment of the present invention, and correspond to FIGS. 1 and 2 showing the first embodiment, respectively. In the second embodiment, a mirror coil 4b is further provided. The mirror coil 4b serves to give, into the chamber, a magnetic field reverse to that of a main coil 4a.

The same effects as in the first embodiment can be obtained by changing a current flowing to the mirror coil 4b (mirror coil current) with the main coil current kept constant.

Figure 8:
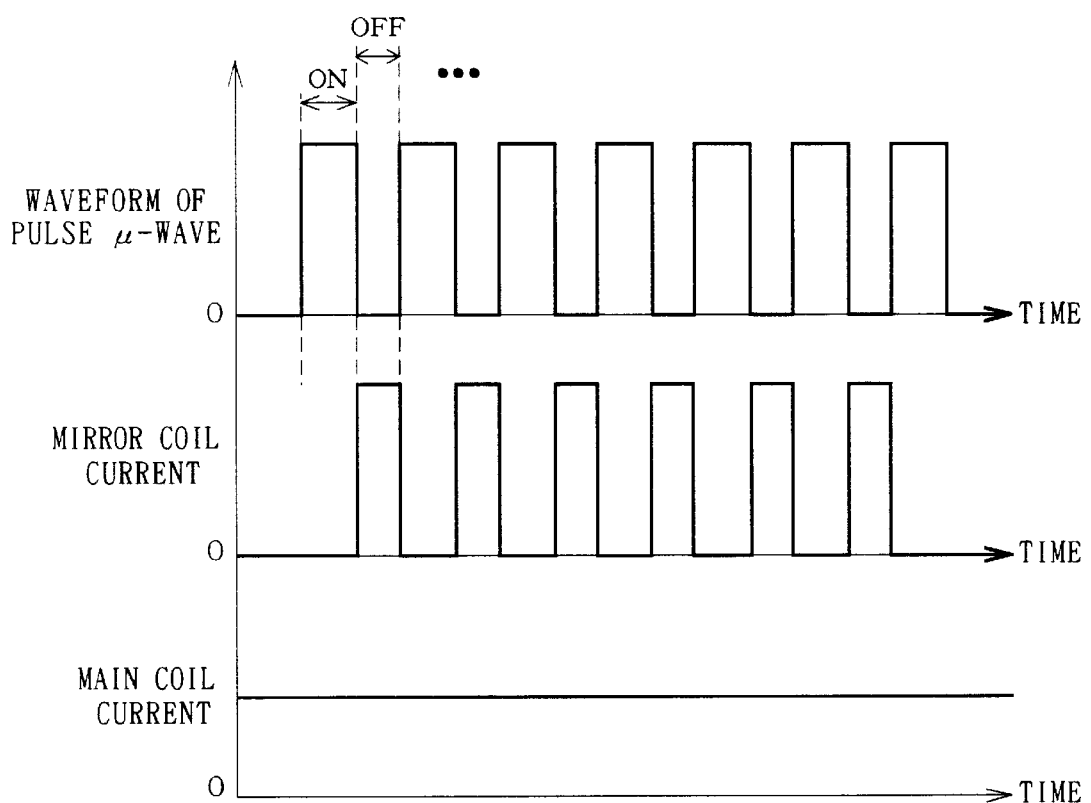
FIG. 8 is a timing chart showing operation of the ECR etching apparatus according to the second embodiment of the present invention.

FIG. 8 is a timing chart showing a relationship between ON/OFF states of a pulse μ-wave and an increase or a decrease in the mirror coil current. FIGS. 6 and 7 show states in which the pulse μ-wave is ON and OFF. In the present embodiment, the mirror coil current flowing for a period in which the pulse μ-wave is OFF is set greater than that for a period in which the pulse μ-wave is ON. For example, the mirror coil current is caused to flow for only the period in which the pulse μ-wave is OFF. Consequently, a magnetic line of force 44 in the chamber for the period in which the pulse μ-wave is OFF has higher divergent properties than those of a magnetic line of force 43 in the chamber for the period in which the pulse μ-wave is ON. Thus, the same effects as in the first embodiment can be obtained.

Also in the present embodiment, it is apparent that the main coil current can also be controlled in the same manner as in the first embodiment.

Third Embodiment

In general, if a plasma density is high, an etching rate is easily increased. However, an ion density for a unit volume is high. Therefore, etching is easily affected locally by an electric field. In other words, charge-up shape anomalies are generated easily. In the ECR apparatus according to the prior art, a mode of a plasma and distribution of the plasma density are fixed. Therefore, a portion to be easily charged up is also fixed.

In consideration of the above-mentioned circumstances, the mode of the plasma is changed with the passage of time to freely regulate the distribution of the plasma density on a time mean, thereby reducing charge-up in the present embodiment.

Figure 9:
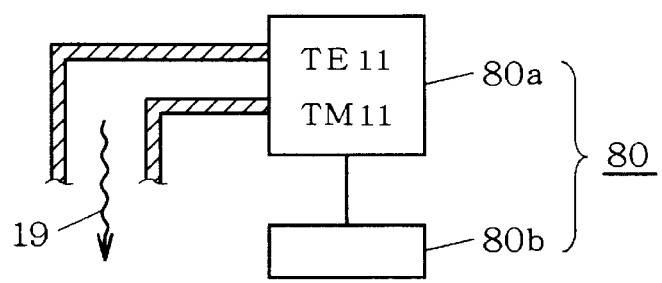
FIG. 9 is a block diagram for explaining a third embodiment of the present invention.

In order to periodically change the mode of the plasma, it is preferred that a μ-wave power supply 80 for alternately oscillating microwaves having a plurality of modes should be provided, for example. FIG. 9 is a block diagram showing an example of a structure of the μ-wave power supply 80 which can be used in the plasma processing apparatus according to the present embodiment. The μ-wave power supply 80 includes a microwave oscillating section 80a capable of oscillating both a TE11 mode and a TM11 mode, and a control section 80b for intermittently sending an output of the microwave oscillating section 80a and for alternately outputting different modes.

Figure 10:
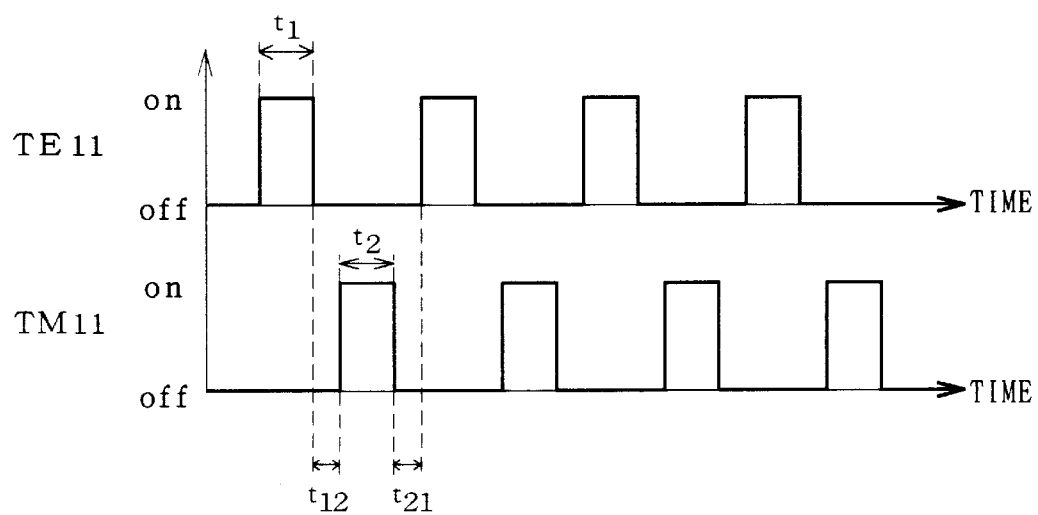
FIG. 10 is a timing chart showing operation of an ECR etching apparatus according to the third embodiment of the present invention.

FIG. 10 is a timing chart showing, in each mode, a timing of ON/OFF states of a microwave 19 oscillated by the μ-wave power supply 80 in FIG. 9. The TE11 and TM11 modes are turned ON for periods t1 and t2, respectively. A period t12 passes while the TE11 mode is turned OFF and the TM11 mode is then turned ON. A period t21 passes while the TM11 mode is turned OFF and the TE11 mode is then turned ON. The periods t1, t2, t12 and t21 are newly employed as parameters of the plasma processing apparatus to perform control. Consequently, the distribution of the density of the plasma produced by the microwave 19 can be controlled. As a matter of course, the periods t12 and t21 may be set to zero.

Fourth Embodiment

Figure 11:
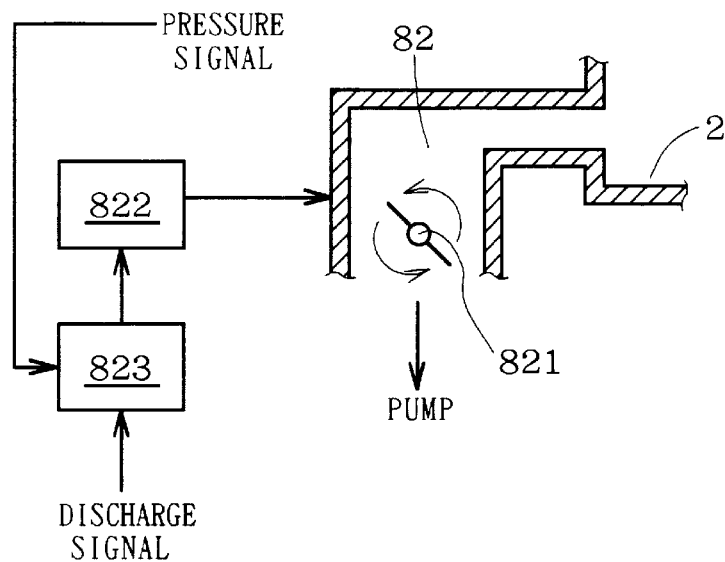
FIG. 11 is a sectional view for explaining a fourth embodiment of the present invention.

FIG. 11 is a sectional view showing a vicinity of an exhaust outlet 82 of an ECR etching apparatus which acts as a plasma processing apparatus according to a fourth embodiment of the present invention. The exhaust outlet 82 is provided with a valve 821. A quantity of a gas exhausted from the exhaust outlet 82 through a pump is regulated depending on an opening of the valve 821 In other words, a pressure in a chamber is controlled depending on the opening of the valve 821.

The opening of the valve 821 is controlled by a valve controller 822. The valve controller 822 is controlled by an opening controller 823. Usually, a vacuum device includes a pressure gauge for measuring a pressure in a chamber and a discharge monitor for confirming a discharge state, by which a pressure signal indicative of the pressure in the chamber and a discharge signal indicative of the presence of discharge are sent to the opening controller 823, respectively.

Figure 12:
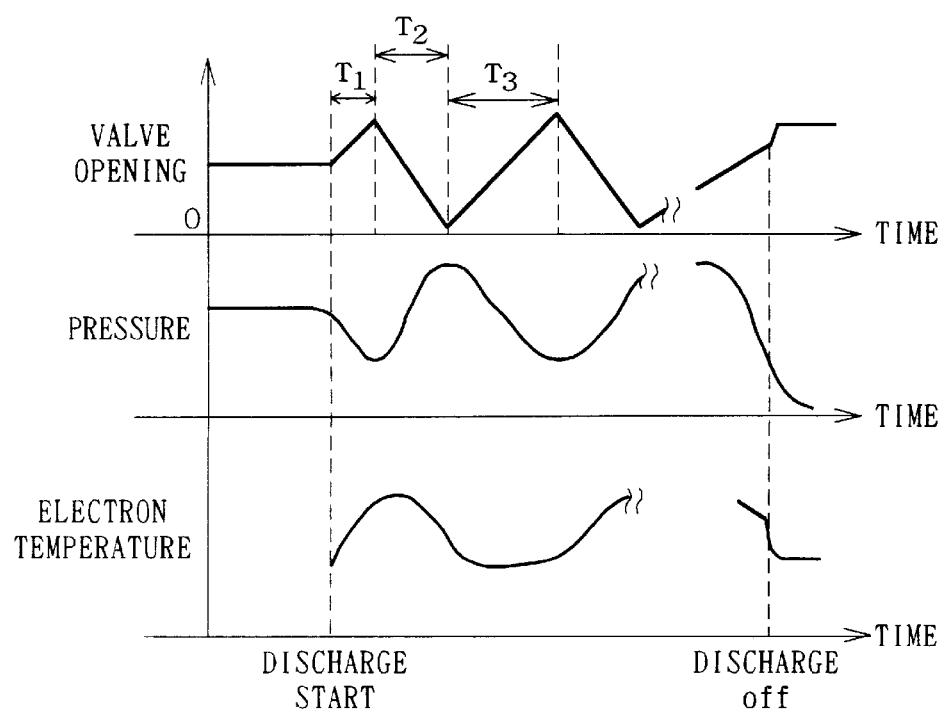
FIG. 12 is a timing chart showing operation of an ECR etching apparatus according to the fourth embodiment of the present invention.

FIG. 12 is a timing chart showing a relationship among the opening of the valve 821, the pressure in the chamber and an electron temperature. When the opening controller 823 confirms that discharge is generated by the discharge signal, it gives the valve controller 822 a command to periodically change the opening of the valve 821. If a plasma processing is completed and the discharge is stopped, the opening controller 823 gives the valve controller 822 a command to fully open the valve 821.

The periodic change of the opening of the valve 821 can be defined according to three periods T1, T2 and T3. The period T1 is a time to start the discharge and then fully open the valve 821. The period T2 is a time to close the fully opened valve 821 to have a minimum opening. The period T3 is a time to open the valve 821 from a minimum to a maximum. These lengths can be set in the opening controller 823 in advance. As a matter of course, the periods T2 and T3 can also be changed with the passage of time. It is desirable that the opening controller 823 should monitor the pressure signal and give the valve controller 822 a command to reduce the opening of the valve 821 irrespective of the above-mentioned periods in order to prevent the valve 821 from being excessively opened to drop the pressure so that the discharge is stopped without intention.

Thus, the opening of the valve 821 is controlled during, the discharge so that the pressure in the chamber fluctuates.

Correspondingly, the electron temperature is also changed. In general, as the pressure is higher, the charged particles collide with each other more frequently. Energy of electrons which are greater than positive ions tends to be lost due to collision. Consequently, a difference in energy between the electrons and the positive ions is reduced. Depending on the difference, a sheath voltage existing between a plasma and a wafer 7 is also decreased. Such a decrease in the sheath voltage reduces anisotropy of progress of the positive ions. Consequently, charge-up is inhibited. On the contrary, if the pressure is lower, the anisotropy of the progress of the positive Ions is increased more.

Accordingly, trade-off of the anisotropy of the plasma processing and the charge-up can be improved by causing the pressure to fluctuate.

Fifth Embodiment

Figure 13:
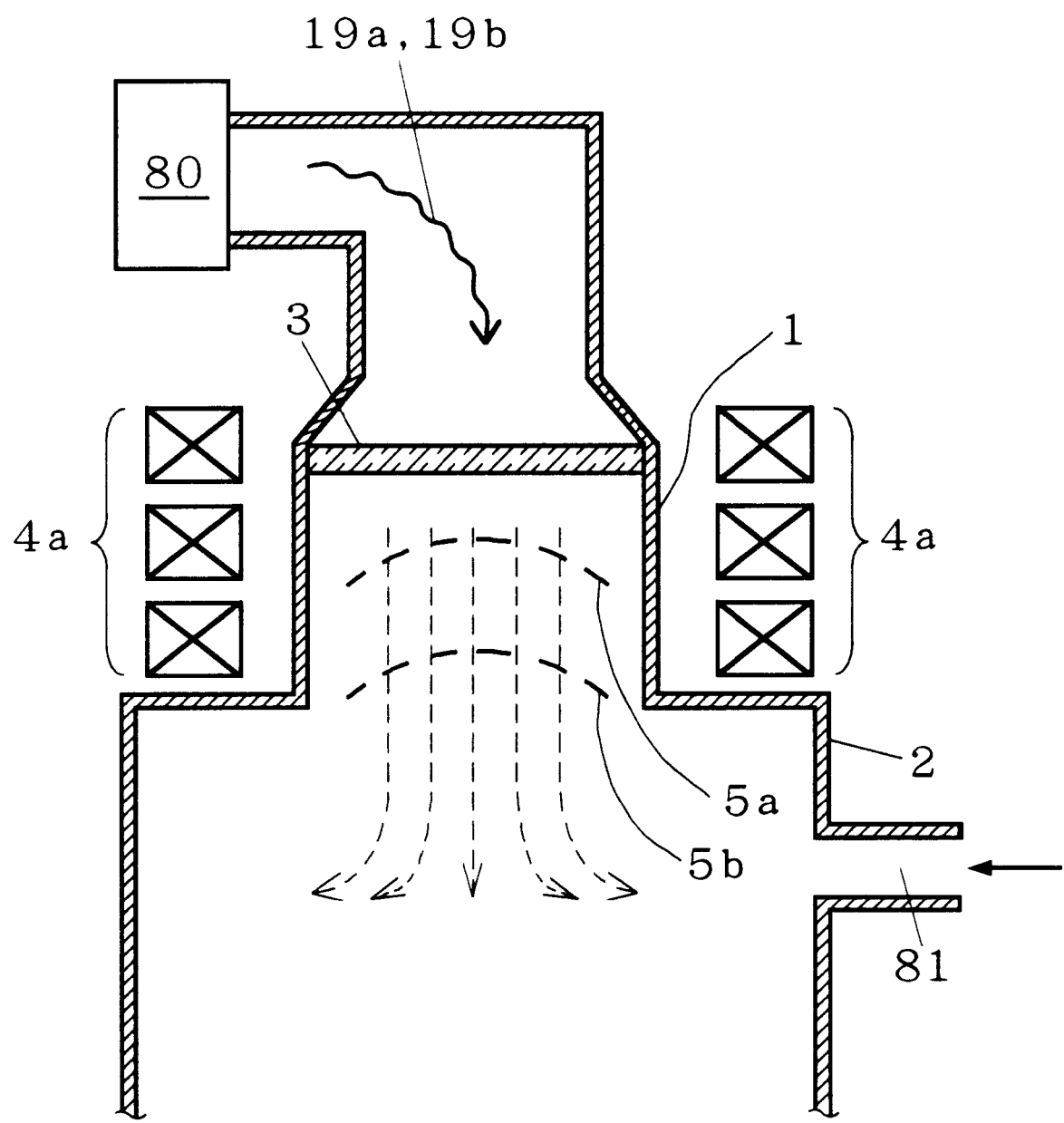
FIG. 13 is a sectional view showing an ECR etching apparatus according to a fifth embodiment of the present invention.

FIG. 13 is a sectional view conceptually showing an ECR etching apparatus which acts as a plasma processing apparatus according to a fifth embodiment of the present invention. A structure of the apparatus shown in FIG. 13 is the same as that according to the first embodiment. Accordingly, portions provided below a reaction chamber 2 are omitted.

In the present embodiment, microwaves 19a and 19b having frequencies different from each other are introduced from a μ-wave power supply 80 into a chamber. A magnetic field which meets ECR resonance conditions is varied depending on the frequency of the microwave. More specifically, if a magnetic flux density is represented by "B", the frequency of the microwave is represented by "f", and a mass of an electron and an electric charge quantity thereof are represented by "m" and "e", an ECR face exists in a portion where a relationship of B=2π fm/e is formed. Usually, a magnetic field formed in the chamber by a main coil 4a is not uniform in a direction where the microwave is introduced into the chamber. Therefore, the magnetic flux density is varied in a vertical direction in FIG. 13. Accordingly, if the microwaves 19a and 19b having different frequencies are introduced into the chamber, different ECR faces 5a and 5b exist.

Conventionally, only a microwave having a frequency of f=2.45 GHz has been introduced, for example. Therefore, the ECR face exists in a portion where a magnetic flux density of the magnetic field formed in the chamber by the main coil 4a is 87.5 mT. However, a microwave having a frequency of f=2.55 GHz is also introduced so that the ECR face exists also in a portion where the magnetic flux density is 91.1 mT.

Thus, a plasma having a plurality of ECR regions can realize a higher density than that of a plasma discharged with a single frequency according to the prior art. Consequently, the present invention is advantageous to a fine processing.

Sixth Embodiment

FIG. 14 is a sectional view conceptually showing an ECR etching apparatus which acts as a plasma processing apparatus according to a sixth embodiment of the present invention. A structure of the apparatus shown in FIG. 14 is the same as that according to the first embodiment. Accordingly, portions provided below a reaction chamber 2 are omitted.

In the present embodiment, a microwave 19 introduced from a μ-wave power supply 80 into a chamber is frequency-modulated. As described in the fifth embodiment, the magnetic field which meets the ECR resonance conditions is varied depending on the frequency of the microwave. Accordingly, if the microwave 19 is frequency-modulated, the frequency is changed with the passage of time. Consequently, an ECR face is moved between different ECR faces 5a and 5b.

In general, if a distance between a wafer 7 and an ECR face 5 is great, a transportation distance of ions is increased. Consequently, the ions have various speed components other than a direction of the wafer 7. Accordingly, although anisotropy of a plasma processing, for example, etching is great, charge-up is easily caused. On the contrary, if the distance between the wafer 7 and the ECR face 5 is great, the anisotropy of the etching is small but the charge-up is caused with difficulty. In the same manner as in the present embodiment, consequently, a position of the ECR face is changed with the passage of time so that trade-off of the anisotropy of the plasma processing and the charge-up can be improved.

Seventh Embodiment

Electric field/magnetic field characteristics determine distribution of a plasma density. Charge-up shape anomalies are greatly affected by the plasma density. More specifically, as the plasma density is increased more, the shape anomalies are generated more easily. However, the electric field/ magnetic field distribution is generally fixed during etching. Therefore, there is a possibility that a portion to be easily charged up might particularly be fixed.

Figure 15:
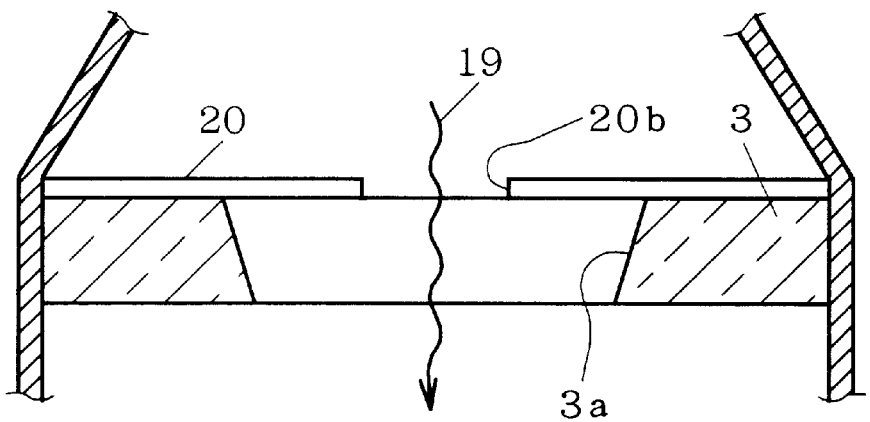
FIG. 15 is a sectional view for explaining a seventh embodiment of the present invention.

In the present embodiment, the electric field/magnetic field characteristics are changed with the passage of time to freely control distribution of the plasma density on a time mean. FIG. 15 is a sectional view showing a vicinity of a leading window 3 of an ECR etching apparatus which acts as a plasma processing apparatus according to a seventh embodiment of the present invention. The leading window 3 has an opening 3a. A lens 20 is provided on the opening 3a. The lens 20 controls a manner of introducing a microwave 19 into a plasma production chamber 1. Therefore, it does not matter whether the lens 20 is provided below the opening 3a or in the middle thereof.

Figure 16:
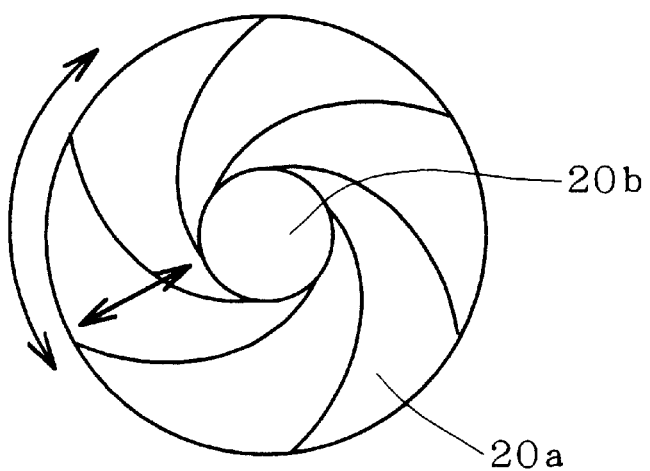
FIG. 16 is a plan view illustrating a structure of a lens 20.

FIG. 16 is a plan view illustrating a structure of the lens 20. The lens 20 is formed by overlapping a plurality of click-shaped dielectrics 20a relative to each other to obtain an iris diaphragm. An opening 20b is surrounded by the dielectrics 20a in a central portion of the lens 20. When the dielectric 20a is rotated, a size of the opening 20b is controlled.

By changing the size of the opening 20b with the passage of time, electric field/magnetic field characteristics of the microwave 19 which passes through the lens 20 can be varied. Therefore, a portion to be easily charged up is not fixed.

Eighth Embodiment

Figure 17:
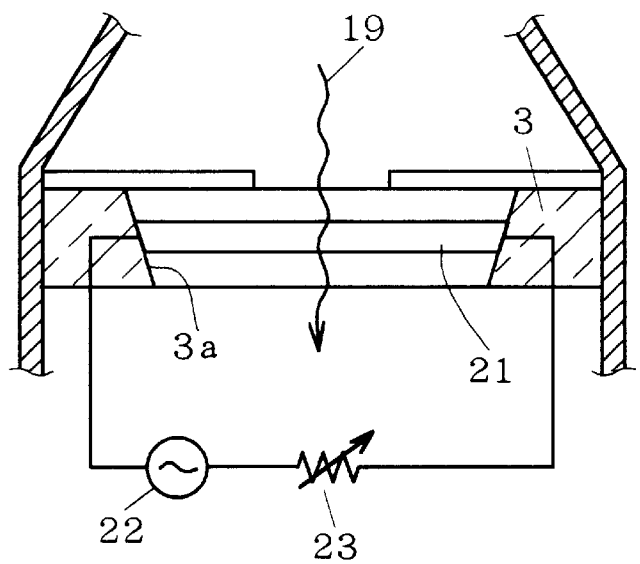
FIG. 17 is a sectional view showing an eighth embodiment of the present invention.

FIG. 17 is a sectional view showing a vicinity of a leading window 3 of an ECR etching apparatus which acts as a plasma processing apparatus according to an eighth embodiment of the present invention. In place of the lens 20 according to the seventh embodiment, a liquid crystal 21 is provided on an opening 3a. A voltage applied to the liquid crystal 21 is controlled on an AC basis by a power control section including an AC power supply 22 and a variable resistor 23. Consequently, the liquid crystal 21 can controllably be opened and closed at a speed of about several milliseconds which is one—several hundredth as high as that of a mechanical structure such as the lens 20. In other words, the electric field/magnetic field characteristics can be changed at a high speed.

Thus, the electric field/magnetic field characteristics can be changed at a high speed when introducing the microwave 19. Consequently, the electric field/magnetic field characteristics can be changed in the form of a pulse. When the lens 20 is used, a period taken to change the electric field/ magnetic field characteristics in the form of the pulse is long.

Therefore, the electric field/magnetic field characteristics are transiently changed for that period. For this reason, it is hard to perform simulation and there is a possibility that a plasma might become unstable.

However, a period in which transient electric field/magnetic field characteristics are generated can extremely be shortened and the electric field/magnetic field characteristics can be changed in the form of the pulse by using the liquid crystal 21. Therefore, unstable factors are not obtained.

Ninth Embodiment

Figure 18:
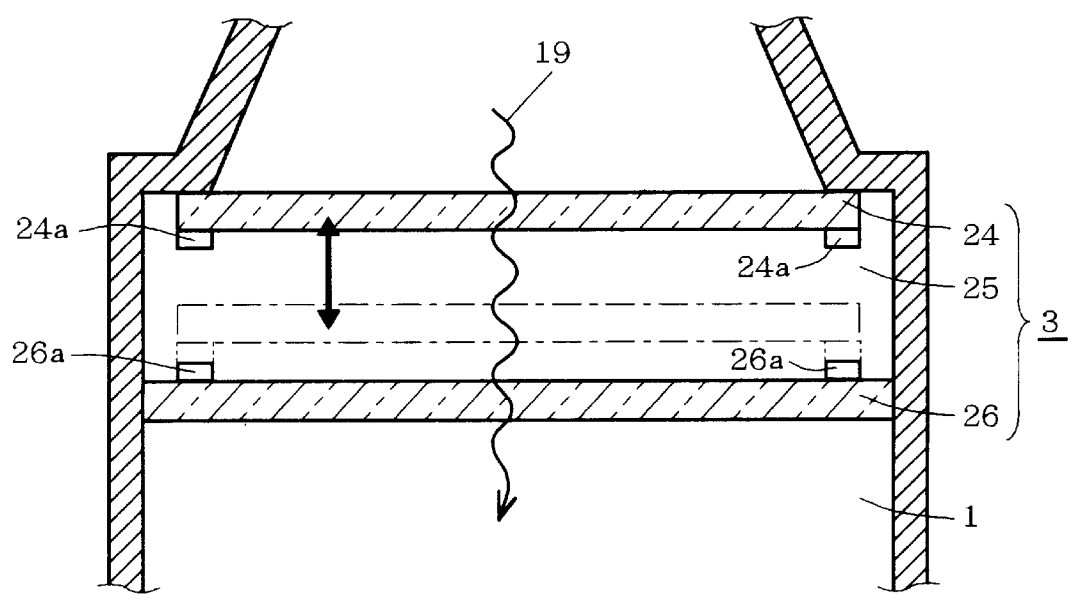
FIG. 18 is a sectional view for explaining a ninth embodiment of the present invention.

FIG. 18 is a sectional view showing a vicinity of a leading window 3 of an ECR etching apparatus which acts as a plasma processing apparatus according to a ninth embodiment of the present invention. The leading window 3 has a three-layer structure having a movable piece 24, a fixed piece 26 and a dielectric 25 interposed therebetween. A magnet 24*a* is provided around a movable piece 24 in the side of the fixed piece 26. A magnet 26*a* is provided around a fixed piece 26 in the side of the movable piece 24. At least one of the magnets 24*a* and 26*a* is an electromagnet by which their attraction and repulsion are controlled. The movable piece 24 is moved above the fixed piece 26 (in a side into which the microwave 19 is introduced).

Quartz is mainly used for the movable piece 24, and the quartz or a dielectric is used for the fixed piece 26. The dielectric 25 is vacuous in order to move the movable piece 24 easily and become thermally inactive.

By periodically moving (that is, vibrating) the movable piece 24, a thickness of the dielectric 25 interposed between the movable piece 24 and the fixed piece 26 can be changed timewise. Consequently, electric field/magnetic field characteristics of the microwave 19 introduced into the chamber can be changed. Accordingly, the same effects as in the seventh embodiment can be obtained.

The microwave 19 used in an ordinary ECR etching apparatus has a wavelength of about 12 cm. It is desirable that the movable piece 24 should be vibrated at an amplitude which is equal to or less than the wavelength of about 12 cm.

Tenth Embodiment

Figure 19:
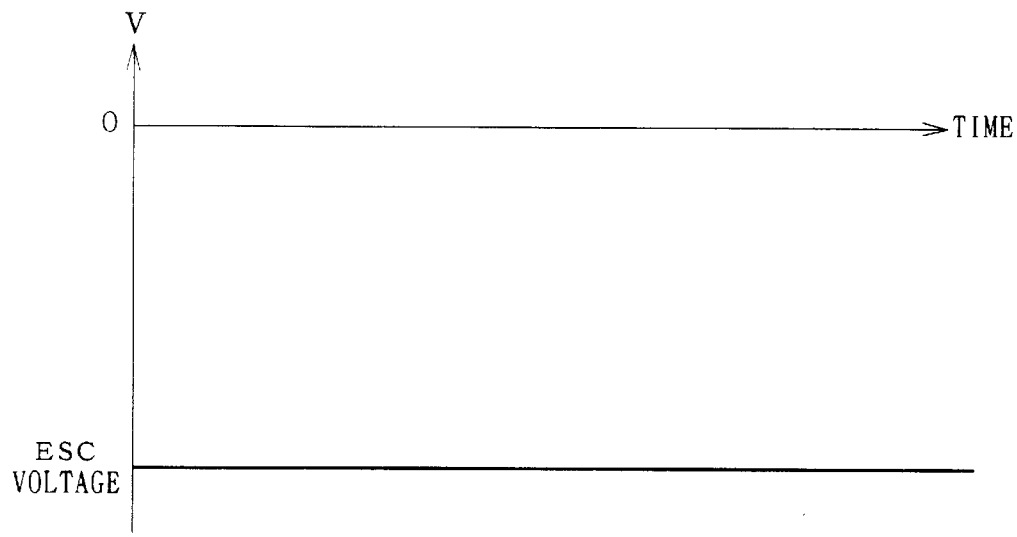
FIG. 19 is a graph showing an example of an ESC voltage according to the background art.

As described in the first embodiment, the wafer 7 comes in contact with the stage 6 by electrostatic chucking with the power supply 9. FIG. 19 is a graph showing a conventional example of an ESC (Electrostatic Chucking) voltage which is an electric potential of the wafer 7 seen from the power supply 9. Although the wafer 7 is grounded, a negative electrode of the power supply 9 is grounded so that the ESC voltage becomes negative.

If the ESC voltage is always applied to negative, the wafer 7 is negatively charged so that electrons arrive with difficulty. In the present embodiment, the ESC voltage is intermittently turned ON to allow the electrons to arrive at the wafer 7. Consequently, charge-up can be reduced.

Figure 20:
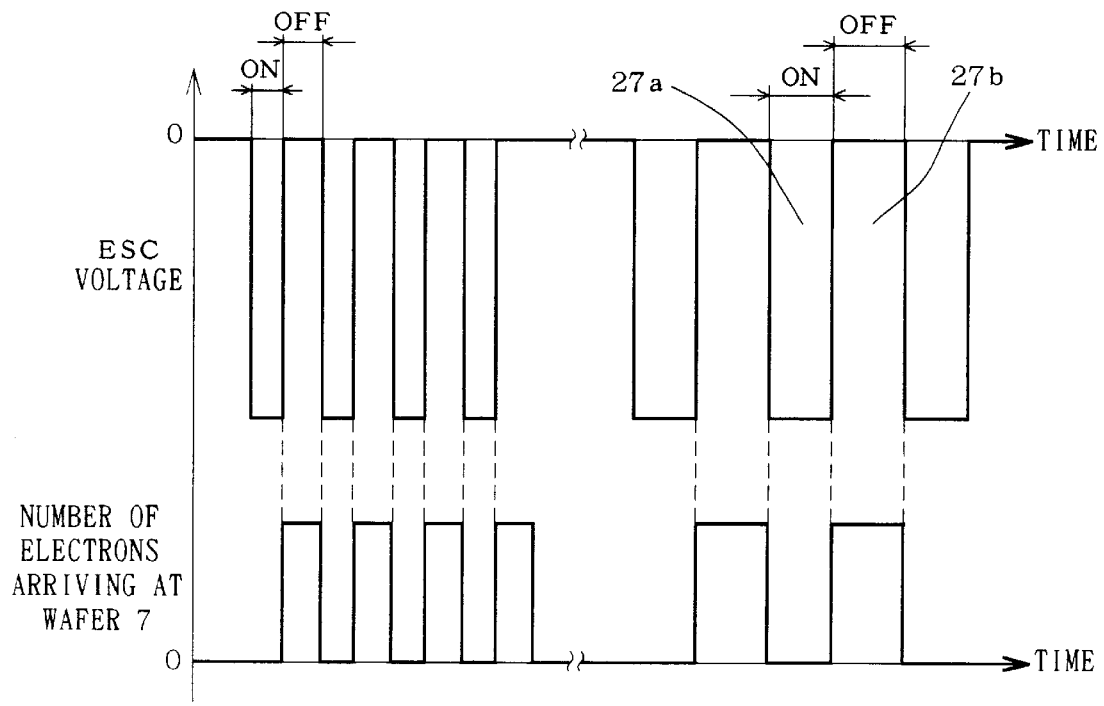
FIG. 20 is a timing chart showing operation according to a tenth embodiment of the present invention.
Figure 21:
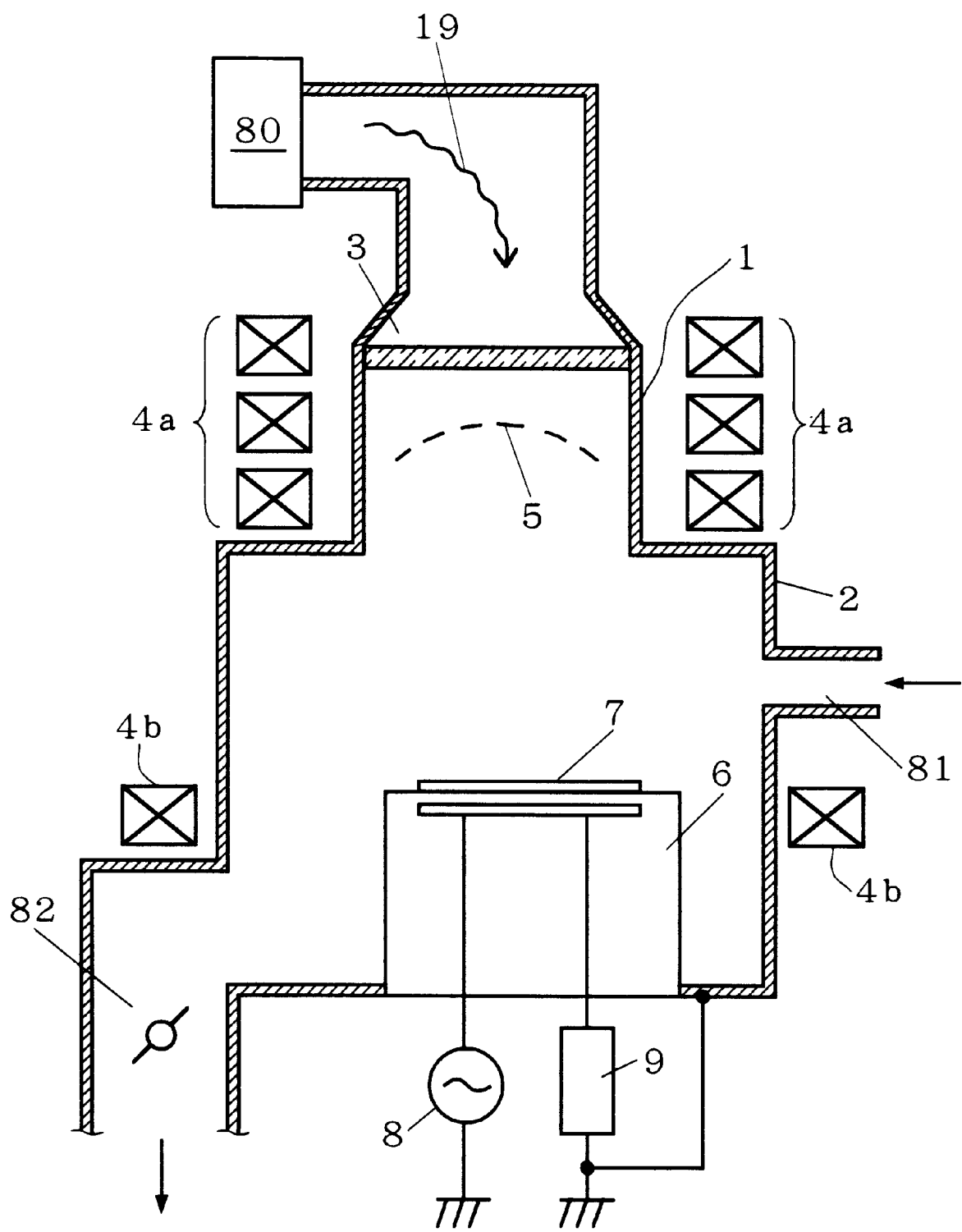
FIG. 21 is a sectional view showing an ECR etching apparatus according to the background art.
Figure 22:
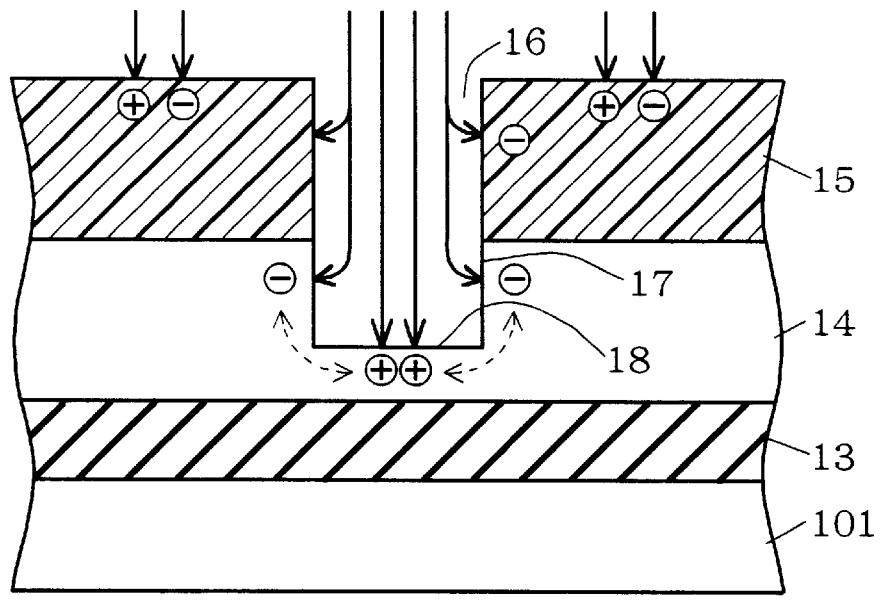
FIG. 22 is a sectional view for explaining charge-up shape anomalies.
Figure 23:
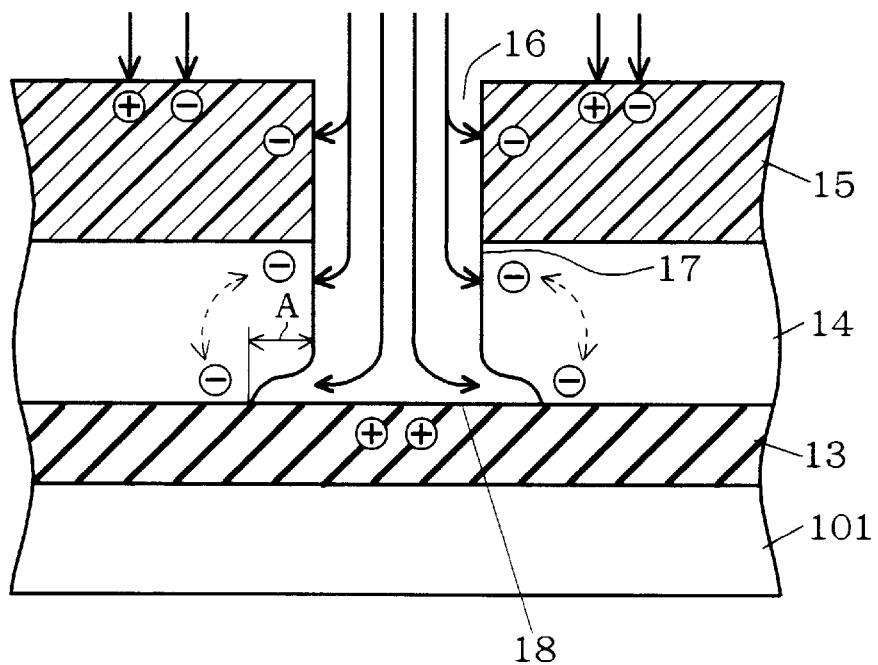
FIG. 23 is a sectional view for explaining the charge-up shape anomalies.

FIG. 20 is a timing chart showing a relationship between the ESC voltage used in the present embodiment and the number of electrons arriving at the wafer 7. By intermittently turning ON the power supply 9, an ON period 27*a* and an OFF period 27*b* alternately appear. An electric potential of the wafer 7 is raised immediately after the ESC voltage is turned OFF. Therefore, a lot of electrons arrive at the wafer 7 for the OFF period 27*b*. Accordingly, while anisotropic etching progresses efficiently for the ON period 27*a*, the charge-up is reduced for the OFF period 27*b*. Therefore, trade-off of the anisotropic etching and the charge-up can be improved.

While the ECR etching apparatus has been described in the above-mentioned embodiments, application of the present invention is not restricted thereto. It is apparent that the present invention is effective in all etching apparatus (for example, an etching apparatus which employs ICP: Induced Coupled Plasma).

While the invention has been described in detail, the foregoing description is in all aspects illustrative and not restrictive. It is understood that numerous other modifications and variations can be devised without departing from the scope of the invention.

We claim:

1. A plasma processing apparatus comprising:

a chamber for storing a sample to be processed;

microwave introducing means for introducing a microwave into said chamber; and magnetic field applying means for applying a magnetic field to said chamber, a plasma produced by said microwave and said magnetic field being exposed to said sample, wherein a frequency of said microwave is changed with the passage of time.

2. A plasma processing apparatus according to claim 1, wherein the microwave has an electron cycrotron resonance (ECR) face and a position of the electron cycrotron resonance (ECR) face of the microwave is moved with the passage of time.

3. A plasma processing apparatus comprising:

a chamber configured to store a sample to be processed;

a microwave introducing device configured to introduce a microwave into said chamber; and a magnetic field applying device configured to apply a magnetic field to said chamber, a plasma introduced by said microwave and said magnetic field being exposed to said sample, wherein a frequency of said microwave is changed with the passage of time.

4. A plasma processing apparatus according to claim 3, wherein the microwave has an electron cycrotron resonance (ECR) face and a position of the electron cycrotron resonance (ECR) face of the microwave is moved with the passage of time.

5. A plasma processing apparatus comprising:

a chamber configured to store a sample to be processed;

a microwave generator configured to generate a microwave having one electron cycrotron resonance (ECR) face into said chamber; and magnetic coils configured to apply a magnetic field to said chamber, a plasma introduced by said microwave and said magnetic field being exposed to said sample, wherein a frequency of said microwave is changed with the passage of time such that a position of the electron cycrotron resonance (ECR) face of the microwave is moved with the passage of time.

6. A plasma processing apparatus according to claim 5, wherein the microwave has an electron cycrotron resonance (ECR) face and a position of the electron cycrotron resonance (ECR) face of the microwave is moved with the passage of time.

* * * * *